(12) United States Patent
Kim et al.

(10) Patent No.: US 8,742,813 B2
(45) Date of Patent: Jun. 3, 2014

(54) INVERTER AND SWITCHING CIRCUIT

(75) Inventors: Yu Sin Kim, Gyeonggi-do (KR); Sang Hee Kim, Gyeonggi-do (KR); Dong Hyun Baek, Seoul (KR); Sun Woo Yun, Seoul (KR); Sung Hwan Park, Gyeonggi-do (KR)

(73) Assignees: Samsung Electro-Mechanics Co., Ltd., Gyunggi-Do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 13/494,914

(22) Filed: Jun. 12, 2012

(65) Prior Publication Data

US 2012/0319737 A1  Dec. 20, 2012

(30) Foreign Application Priority Data

Jun. 14, 2011  (KR) .................. 10-2011-0057625

(51) Int. Cl.
*H03K 19/20* (2006.01)
*H03K 19/0948* (2006.01)

(52) U.S. Cl.
USPC ........... 327/225; 327/210; 327/213; 327/437; 326/108; 326/121

(58) Field of Classification Search
None
See application file for complete search history.

(56) References Cited

U.S. PATENT DOCUMENTS 6,127,845 A * 10/2000 Kolze et al. .................. 326/41
6,194,914 B1 * 2/2001 Sako .............................. 326/113
6,222,397 B1 * 4/2001 Yamazaki ..................... 327/112
7,414,442 B2    8/2008 Uno
8,264,254 B2 * 9/2012 Osame et al. ................. 326/104
2012/0112813 A1 * 5/2012 Hoff et al. ..................... 327/199

FOREIGN PATENT DOCUMENTS

| JP | 01-280921 A | 11/1989 |
| JP | 2004-153577 A | 5/2004 |
| JP | 2007329646 A | 12/2012 |
| KR | 10-2010-0097342 A | 9/2010 |

OTHER PUBLICATIONS

KR 10-2011-0057625 Notice of Allowance dated Oct. 28, 2013; 2pgs.

* cited by examiner

*Primary Examiner* — Lincoln Donovan
*Assistant Examiner* — Terry L Englund
(74) *Attorney, Agent, or Firm* — Bracewell & Giuliani LLP; Brad Y. Chin (57) ABSTRACT

An inverter and an antenna circuit. The inverter that receives control signals including a first control signal, a second control signal, and a third control signal, inverts the first control signal, and outputs the inverted first control signal, includes: a first MOS transistor having a gate to which the first control signal is applied and a source that is grounded; a second MOS transistor having a gate to which the third control signal is applied and a source to which the second control signal is applied; and a third MOS transistor having a gate to which the second control signal is applied and a source to which the third control signal is applied, wherein drains of the first MOS transistor, the second MOS transistor, and the third MOS transistor are connected to an output terminal.

9 Claims, 5 Drawing Sheets

INVERTER AND SWITCHING CIRCUIT

CROSS REFERENCE(S) TO RELATED APPLICATIONS

This application claims the benefit under 35 U.S.C. Section 119 of Korean Patent Application Serial No. 10-2011-0057625, entitled "Inverter and Switching Circuit" filed on Jun. 14, 2011, which is hereby incorporated by reference in its entirety into this application.

BACKGROUND OF THE INVENTION

1. Technical Field

The present invention relates to an inverter and a switching unit.

2. Description of the Related Art

In electronic and electric fields, an inverter generally means a device converting DC power into AC power. However, an inverter used in digital signal processing fields means an electronic logic gate manufactured in an integrated circuit (IC) type, which converts a received signal.

Recently, miniaturization of electronic devices, extension of a battery life through reduction in power consumption, and the like, have been in the limelight in the electronic and electric fields.

Meanwhile, a general inverter according to the related art can only be operated when separate external power VDD is applied thereto.

Therefore, there has been a difficulty in making the inverter on-chip with various components, and the inverter should be provided with a separate pin for receiving external power to thereby have a limitation in miniaturization thereof.

In general, when external power is supplied, power is continuously supplied regardless of an operation of the corresponding component, such that unnecessary power consumption is generated.

SUMMARY OF THE INVENTION

An object of the present invention is to provide an inverter capable of performing an inverting operation without external power.

Another object of the present invention is to provide a switching circuit.

According to an exemplary embodiment of the present invention, there is provided an inverter that receives control signals, inverts the control signals, and outputs the inverted control signals, the inverter including: a first transistor having a control terminal to which a first control signal is applied and one end that is grounded; a second transistor having a control terminal to which a third control signal is applied and one end to which a second control signal is applied; and a third transistor having a control terminal to which the second control signal is applied and one end to which the third control signal is applied, wherein the other ends of the first transistor, the second transistor, and the third transistor are connected to an output terminal.

The first transistor may be an N-type MOS transistor.

The second transistor and the third transistor may be P-type MOS transistors.

According to another exemplary embodiment of the present invention, there is provided an inverter that receives n control signals, inverts control signals to be inverted and outputs the inverted control signals, the inverter including: a first transistor having a control terminal to which control signals to be inverted are applied and one end that is grounded; and a plurality of second transistors having control terminals to which a first control signal is applied and one ends to which a second control signal is applied, each of the first and second control signals being selected in pair in consideration of sequence of control signals other than the control signals to be inverted, wherein the other ends of the first transistor and the second transistor are connected to an output terminal.

(n−1)*(n−2) second transistors may be provided (where n represents an integer of more than three).

The first transistor may be an N-type MOS transistor.

Each of the second transistors may be P-type MOS transistors.

According to another exemplary embodiment of the present invention, there is provided an inverter that receives n control signals, inverts control signals to be inverted and outputs the inverted control signals, the inverter including: a first transistor having a control terminal to which control signals to be inverted are applied and one end that is grounded; and a plurality of second transistors having control terminals to which a first control signal is applied and one ends to which a second control signal is applied, each of the first and second control signals being selected in pair in consideration of sequence of control signals other than the control signals to be inverted, wherein n inverting units having output terminals to which the other ends of the first transistor and the second transistor are connected are provided to invert each of the n control signals and output the n inverted signals.

According to another exemplary embodiment of the present invention, there is provided a switching circuit, including: a power generating circuit receiving control signals to generate power; and an inverter receiving control signals and inverting control signals to be inverted to output the inverted control signals, without separate power.

The switching circuit may further include a switching unit including a plurality of input and output terminals and a plurality of switches turning on/turning off between the respective input and output terminals.

The switching circuit may further include a buffer unit receiving and transferring the control signals to the switching unit.

The buffer unit may receive power generated from the power generating circuit.

Signals output from the inverter may be transferred to the switching unit.

The switching circuit may further include a switching unit including: a plurality of input and output terminals; at least one antenna; a plurality of first switches turning on/turning off between the respective input and output terminals and the antenna; and a plurality of second switches turning on/turning off between the respective input and output terminals and a ground terminal.

The switching circuit may further include a buffer unit receiving and transferring the control signals to the switching unit.

The buffer unit may receive power generated from the power generating circuit.

Signals output from the inverter may be transferred to the switching unit.

Signals output from the buffer unit may be applied to the first switch or the second switch to control a turn-on/turn-off thereof.

Control signals not passing through the buffer unit may be applied to one of the first switch and the second switch, to which the signals output from the buffer unit are not applied.

Signals passing through the inverter unit may be applied to one of the first switch and the second switch, to which the signals output from the buffer unit are not applied.

The first switch may be a series switch and the second switch may be a shunt switch.

The power generating circuit may be connected to the buffer unit to supply power thereto.

The power generating circuit may include: a first transistor including a control terminal to which a third control signal is applied and one end to which a first control signal is applied; a second transistor including a control terminal to which a second control signal is applied and one end to which the other end of the first transistor is connected; a third transistor having a control terminal to which the first control signal is applied and one end to which the second control signal is applied; a fourth transistor having a control terminal to which the third control signal is applied and one end to which the other end of the third transistor is connected; a fifth transistor having a control terminal to which the second control signal is applied and one end to which the third control signal is applied; and a sixth transistor having a control terminal to which the first control signal is applied and one end to which the other end of the fifth transistor is connected, the other ends of the second transistor, the fourth transistor and the sixth transistor being connected to an output terminal.

When any one of the first control signal, the second control signal, and the third control signal is a turn-on signal, power may be output from the output terminal.

The first transistor to sixth transistor may be P-type MOS transistors.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to the embodiments set forth herein.

These embodiments may be provided so that this disclosure will be thorough and complete, and will fully convey the scope of the invention to those skilled in the art. Like reference numerals in the drawings denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, the present invention will be described in detail with reference to the accompanying drawings.

Figure 1:
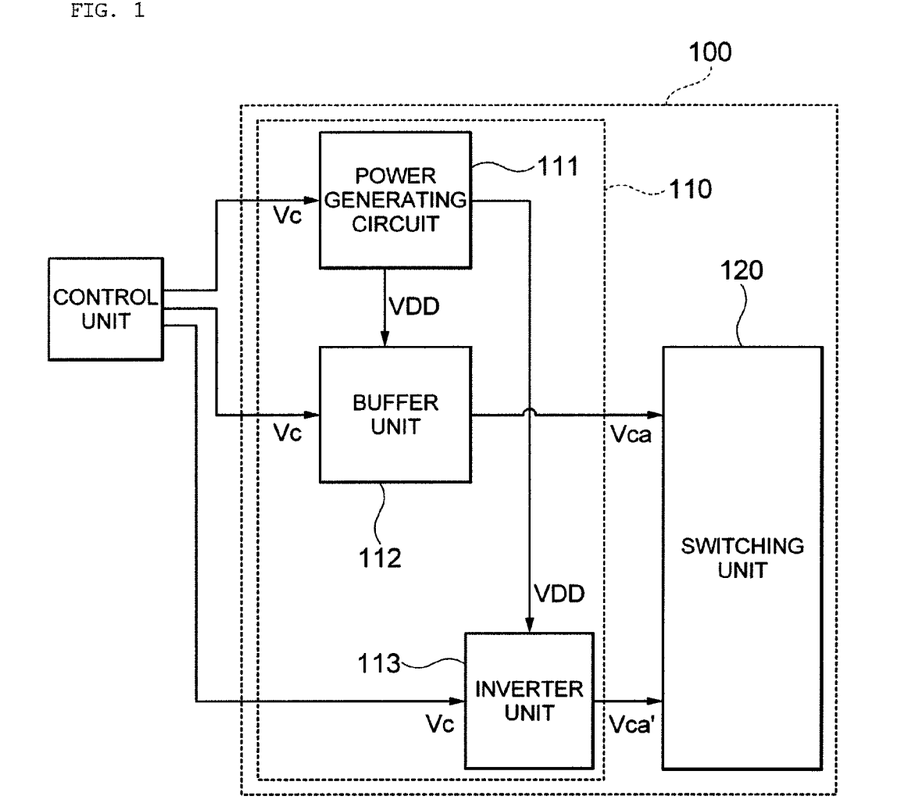
FIG. 1 is a block diagram schematically showing a switching circuit according to an exemplary embodiment of the present invention.

FIG. 1 is a block diagram schematically showing a switching circuit according to an exemplary embodiment of the present invention.

Referring to FIG. 1, a switching circuit 100 according to an exemplary embodiment of the present invention may be configured to include a driving unit 110 and a switching unit 120.

In this case, the driving unit 110 may be configured to include a power generating circuit 111, a buffer unit 112, and an inverter unit 113.

A control unit that generates a control signal may be implemented as various chipsets.

The power generating circuit 111 may be applied with a control signal generated from a control unit that may be implemented as various chipsets to serve to function for generating power voltage VDD to be supplied to the buffer unit 112.

In addition, the inverter unit 113 may perform an inverting operation only with an input of the control signal, without separate external power.

Therefore, the buffer unit 112 and the inverter unit 113 may be applied with power supplied from the power generating circuit 111, without separate external power, and be driven, such that the entire size of the switching circuit 100 may be reduced.

Meanwhile, the switching unit 120 may include a plurality of input and output terminals, an antenna, and switches, and serve to connect or block specific input and output terminals to or from the antenna.

Figure 2:
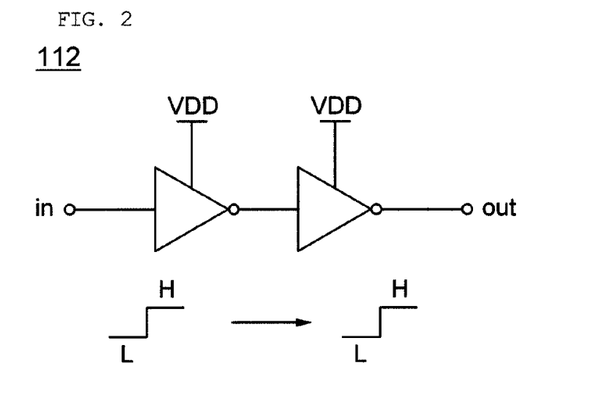
FIG. 2 is a diagram showing a configuration of a buffer unit and signal transfer characteristics thereof.
Figure 3:
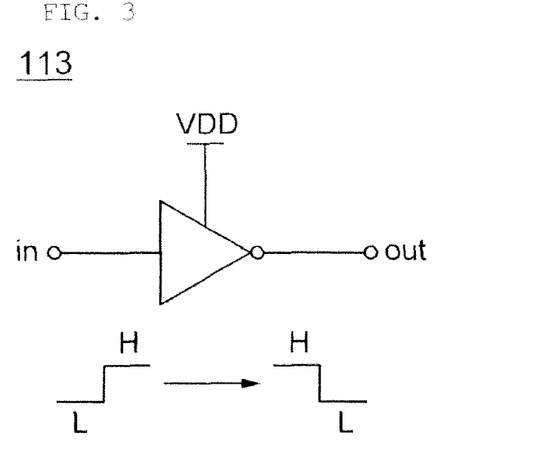
FIG. 3 is a diagram showing a configuration of an inverter unit and signal transfer characteristics thereof.

FIG. 2 is a diagram showing a configuration of a buffer unit 112 and signal transfer characteristics thereof, and FIG. 3 is a diagram showing a configuration of an inverter unit 113 and signal transfer characteristics thereof.

As shown in FIGS. 2 and 3, the buffer unit 112 outputs the same control signal as the input control signal and the inverter unit 113 inverts the input control signal to output the inverted control signal.

In this case, the power generating circuit 111 may be connected to the buffer unit 112 to supply power thereto, such that the buffer unit 112 and the inverter unit may be driven without separate external power.

Figure 4:
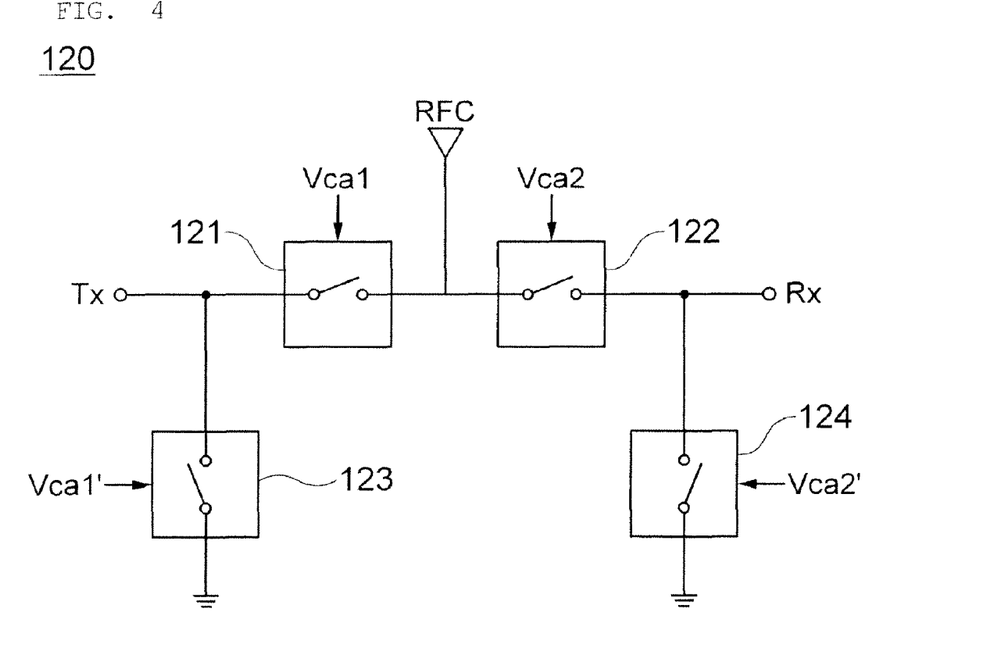
FIG. 4 is a diagram showing a switching unit according to an exemplary embodiment of the present invention.

FIG. 4 is a diagram showing a switching unit 120 according to an exemplary embodiment of the present invention.

Referring to FIG. 4, the switching unit 120 may be configured to include a plurality of input and output terminals, an antenna, and switches. In this case, the switch may include a first switch and a second switch.

The first switch is provided in each of the input and output terminals and the antenna to perform a turn-on/turn-off operation, thereby making it possible to connect or block specific input and output terminals to or from the antenna, and the second switch is provided in each of the input and output terminals and a ground terminal to perform a turn-on/turn-off operation, thereby making it possible to connect or block the input and output terminals to or from the ground terminal.

In FIG. 4, a first series switch 121 and a second series switch 122 may correspond to the first switch and a first shunt switch 123 and a second shunt switch 124 may correspond to the second switch.

In this case, a control signal Vca1 output from the buffer unit 112 is applied to the first series switch 121 and a control signal Vca2 output therefrom is applied to the second series switch 122, thereby making it possible to turn-on/turn-off the corresponding switch.

In addition, a control signal Vca1' output from the inverter unit 113 is applied to the first shunt switch 123 and a control signal Vca2' output therefrom is applied to the second shunt switch 124, thereby making it possible to turn-on/turn-off the corresponding switch.

Meanwhile, the buffer unit 112 and the inverter unit 113 may be applied with the same control signal, wherein the inverter unit 113 may invert the input control signal and output the inverted control signal.

Therefore, the signals Vca1 and Vca2 output from the buffer unit 112 may have a complementary relationship with the signals Vca1' and Vca2' output from the inverter unit 113. That is, when the signal Vca1 is an H signal, the signal Vca1' may be an L signal.

Therefore, the first series switch 121 and the first shunt switch 123 may be complementarily turned-on/turned-off, and the second series switch 122 and the second shunt switch 124 may also be complementarily turned-on/turned-off.

Figure 5:
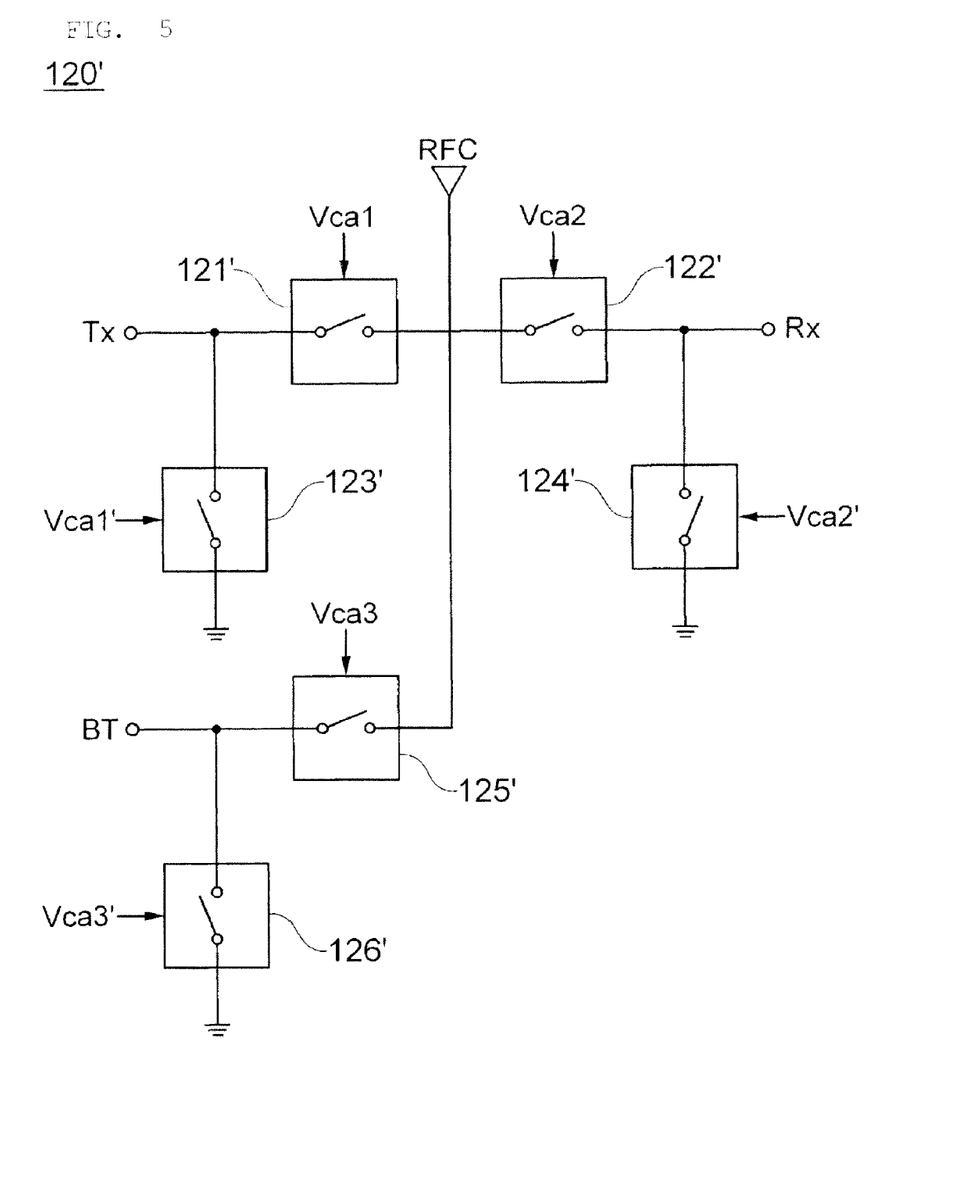
FIG. 5 is a modified example of FIG. 4.

FIG. 5 is a modified example of FIG. 4, wherein the switching unit 120 having three input and output terminals is illustrated.

In this case, the input and output terminals are illustrated as Tx, Rx, and Bt in FIG. 5 but they are not limited thereto. Referring to FIG. 5, each of the control signals Vca1, Vca2, and Vca3 passing through the buffer unit 112 controls the turn-on/turn-off of each of a first series switch 121', a second series switch 122', and a third series switch 125' provided between input and output terminals Tx, Rx, and BT and an antenna RFC, thereby making it possible to connect or block each of the input and output terminals to or from the antenna.

In this case, the signals Vca1', Vca2', and Vca3' output from the inverter may connect or block the input and output terminals of each of a first shunt switch 123', a second shunt switch 124', and a third shunt switch 126' provided between the input and output terminals and a ground to or from the ground.

Figure 8:
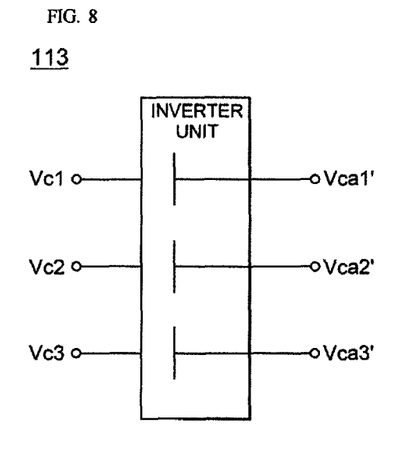
FIG. 8 is a diagram showing a configuration of an inverter according to an exemplary embodiment of the present invention.

In addition, with respect to the signals Vc1, Vc2, and Vc3, at least two signals thereof may not simultaneously be H signals as shown in FIG. 8. Therefore, the input and output terminals Tx, Rx, and BT are not simultaneously connected to the antenna.

The signal Vca1' is an inverted signal of Vc1, such that the first, second, and third series switches and the first and, second, and third shunt switches may be complementarily turned-on/turned-off.

In general, minute signals may pass through the switches even in a turn-off state.

However, the first, second, and third series switches and the first, second, and third shunt switches are complementarily operated as described above, such that when one input and output terminals are connected to the antenna, it is possible to more completely block between the other input and output terminals and the antenna, whereby noise of the signal transmitted between the input and output terminals and the antenna can be reduced and accuracy can be improved.

Figure 6A:
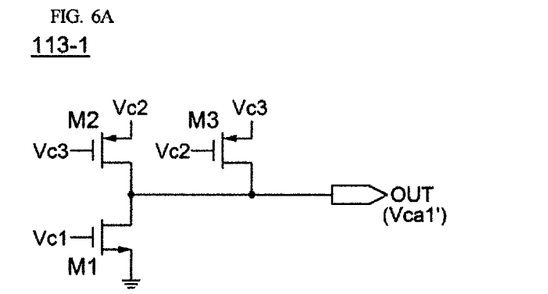
FIG. 6A is a circuit diagram showing a configuration of an inverter according to an exemplary embodiment of the present invention.

FIG. 6A is a circuit diagram showing a configuration of an inverter according to an exemplary embodiment of the present invention.

Referring to FIG. 6A, the inverter according to an exemplary embodiment of the present invention is applied with control signals including a first control signal, a second control signal, and a third control signal to output the inverted signals and is configured to include a first MOS transistor M1, a second MOS transistor M2, and a third MOS transistor M3.

The first MOS transistor M1 may have a gate to which a first control signal is applied, a source that is grounded, and a drain to which an input terminal is connected.

The second MOS transistor M2 may have a gate to which the third control signal is applied, a source to which a second control signal is applied, and a drain to which an input terminal is connected.

The third MOS transistor M3 may have a gate to which a second control signal is applied, a source to which a third control signal is applied, and a drain to which an input terminal is connected.

In this case, the first MOS transistor M1 may be an N-type MOS transistor.

The second MOS transistor M2 and the third MOS transistor M3 may be P-type MOS transistors.

In FIG. 6A, the first control signal, the second control signal, and the third control signal are illustrated as Vc1, Vc2, and Vc3, respectively.

Referring to FIG. 6A, the control signals are applied by being divided into three cases as shown in Table 1 below. When Vc1 is inverted and output, it may be set to the first control signal input to the gate of the first MOS transistor M1.

TABLE 1

| Vc1 [INPUT] | Vc2 | Vc3 | Vca1' [OUTPUT] |
| --- | --- | --- | --- |
| H | L | L | L |
| L | H | L | H |
| L | L | H | H |

According to Table 1, when Vc1 is an H signal, Vca1' becomes an L signal, and when the control signal Vc1 is an L signal, Vca1' which is an H signal is output.

In more detail, when Vc1 is an H signal, the source and the drain of the first MOS transistor M1 are electrically connected to each other, such that the output terminal is connected to the ground terminal and thus, an L signal is output from the output terminal.

Meanwhile, when Vc1 is an L signal, the source and the drain of the first MOS transistor M1 are electrically blocked from each other, such that the output terminal is not connected to the ground terminal.

In addition, the signals Vc3 and Vc2 are applied to the gate and the source of the second MOS transistor M2, respectively, and the signals Vc2 and Vc3 are applied to the gate and the source of the third MOS transistor M3, respectively. When any one of the control signals Vc2 and Vc3 is an H signal, the H signal is output from one drain of the second MOS transistor M2 and the third MOS transistor M3.

Therefore, when Vc1 is an L signal, Vca1' becomes an H signal.

Figure 6B:
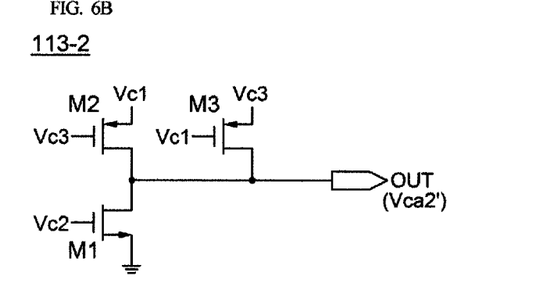
FIG. 6B is a circuit diagram showing a configuration of an inverter according to an exemplary embodiment of the present invention.

FIG. 6B is a circuit diagram showing a configuration of an inverter according to an exemplary embodiment of the present invention.

Referring to FIG. 6B, the first control signal, the second control signal, and the third control signal are illustrated as Vc2, Vc1, and Vc3, respectively, differently from FIG. 6A, and others are the same as the explanation described with reference to FIG. 6A, such that an overlapped explanation thereof will be omitted.

Referring to FIG. 6B, the control signals are applied by being divided into three cases as shown in Table below. When Vc2 is inverted and output, it may be set to the first control signal input to the gate of the first MOS transistor M1.

TABLE 2

| Vc1 | Vc2[INPUT] | Vc3 | Vca2'[OUTPUT] |
|---|---|---|---|
| H | L | L | H |
| L | H | L | L |
| L | L | H | H |

According to Table 2, when Vc2 is an H signal, Vca2' becomes an L signal, and when Vc2 is an L signal, Vca2' which is an H signal is output.

Explanation on the specific principle thereof is similar to that described with reference to FIG. 6 and the explanation thereof will be omitted.

Figure 6C:
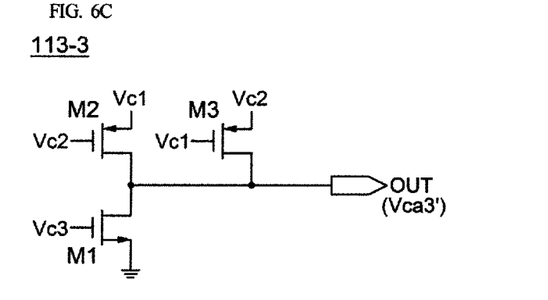
FIG. 6C is a circuit diagram showing a configuration of an inverter according to an exemplary embodiment of the present invention.

FIG. 6C is a circuit diagram showing a configuration of an inverter according to an exemplary embodiment of the present invention.

Referring to FIG. 6C, the first control signal, the second control signal, and the third control signal are illustrated as Vc3, Vc1, and Vc2, respectively, differently from FIG. 6A, and others are the same as the explanation described with reference to FIG. 6A, such that an overlapped explanation thereof will be omitted.

Referring to FIG. 6C, the control signals are applied by being divided into three cases as shown in Table 3 below. When Vc3 is inverted and output, it may be set to the first control signal input to the gate of the first MOS transistor M1.

TABLE 3

| Vc1 | Vc2 | Vc3[INPUT] | Vca3'[OUTPUT] |
|---|---|---|---|
| H | L | L | H |
| L | H | L | H |
| L | L | H | L |

According to Table 3, when Vc3 is an H signal, Vca3' becomes an L signal, and when Vc3 is an L signal, Vca3' which is an H signal is output.

Explanation on the specific principle thereof is similar to that described with reference to FIG. 6 and the explanation thereof will be omitted.

Figure 7:
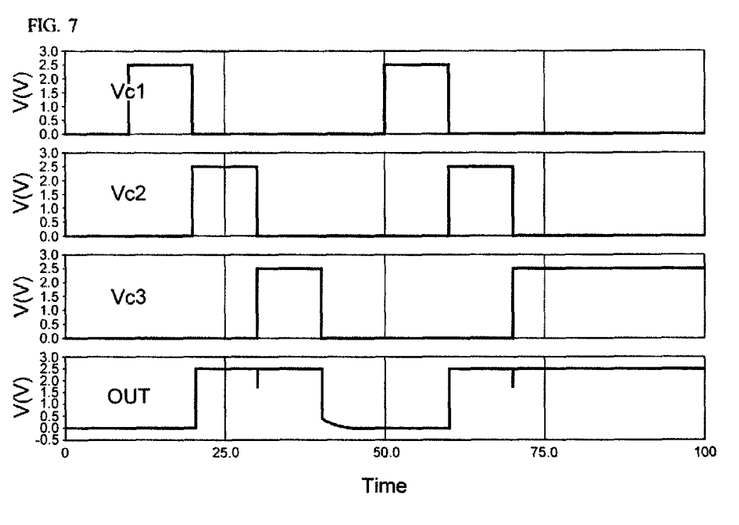
FIG. 7 is a diagram showing signals of input and output terminals of the inverter of FIG. 6A.

FIG. 7 is a graph showing signals of input and output terminals of the inverter of FIG. 6A.

As shown in FIG. 7, when outputting Vca1' by inverting Vc1, Vca1' which is an L signal is output during a period in which Vc1 is an H signal, and Vca1' which is an H signal is output during a period in which Vc1 is an L signal.

When Vc1, Vc2, and Vc3 are an L signal, Vca1' (OUTPUT) becomes an L signal.

Although not shown, when Vc1, Vc2, and Vc3 are an L signal, both Vca2' (OUTPUT) and Vca3' (OUTPUT) become an L signal.

When any one of the control signals input following the principles as described above is an H signal, an inverter inverting the input control signal and outputting the inverted control signal may be implemented, without separate external power.

Meanwhile, FIG. 6 shows the configuration of the inverter in a case in which there are three control signals, however, the inverter may be configured to include a first MOS transistor and a plurality of second MOS transistors in a case in which there are n control signals.

The first MOS transistor may have a gate to which a control signal to be inverted is applied, a source that is grounded, and a drain to which an input terminal is connected.

The second MOS transistor may have a gate and a source to which two of the control signals other than the control signal to be inverted are applied, respectively, and a drain to which an input terminal is connected.

The second MOS transistor may be provided in plural.

In this case, the control signals other than the control signal to be inverted among the n control signals are selected in consideration of sequence according to permutation, thereby making it possible to reflect all of the number of cases.

In addition, when all of the number of cases are reflected, the $(n-1)P=(n-1)!/(n-3)!$ (! is factorial, P is permutation) second MOS transistors may be provided according to permutation.

In addition, the first MOS transistor may be an N-type MOS transistor, and the second MOS transistor may be a P-type MOS transistor.

Meanwhile, FIG. 8 is a diagram showing a configuration of an inverter according to an exemplary embodiment of the present invention. FIG. 8 shows a case in which there are three control signals, however, the present invention is not limited thereto.

Referring to FIG. 8, it is possible to configure an inverter that includes n inverting units including the first MOS transistor and the second MOS transistor, inverts each of the n control signals and outputs the n inverted signals, when receiving n control signals, inverting control signals to be inverted and outputting the inverted control signals.

The inverter according to the present invention configured as above may perform an inverting operation without separate power, thereby making it possible to minimize various electronic devices to which the inverter is applied and reduce power consumption of the electronic devices.

In addition, the antenna circuit including the inverter of the present invention can be further miniaturized and thus, power consumption can also be reduced. As a result, when the antenna circuit including the inverter is applied to devices receiving power through a battery, the battery life can be extended.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. An inverter that receives control signals including a first control signal, a second control signal, and a third control signal, inverts the first control signal, and outputs the inverted first control signal, the inverter comprising:
- a first transistor having a control terminal to which the first control signal is applied and one end that is grounded;
- a second transistor having a control terminal to which the third control signal is applied and one end to which the second control signal is applied; and
- a third transistor having a control terminal to which the second control signal is applied and one end to which the third control signal is applied,
- wherein the other ends of the first transistor, the second transistor, and the third transistor are connected to an output terminal.

2. The inverter according to claim 1, wherein the first transistor is an N-type MOS transistor.

3. The inverter according to claim 1, wherein the second transistor and the third transistor are P-type MOS transistors.

4. A switching circuit, comprising:
- an inverter according to claim 1;
- a power generating circuit receiving the first to third control signals to generate power; and
- a switching unit including:
  - three input terminals;
  - at least one antenna;
  - three first switches turning on/turning off between the respective input terminals and the antenna; and
  - three second switches turning on/turning off between the respective input terminals and a ground terminal.

5. The switching circuit according to claim 4, wherein the first transistor is an N-type MOS transistor.

6. The switching circuit according to claim 4, wherein the second transistor and the third transistor are P-type MOS transistors.

7. The switching circuit according to claim 4, further comprising:
- a buffer unit receiving and transferring the first control signal, the second control signal, and the third control signal to the switching unit,
- wherein the buffer unit receives the power generated from the power generating circuit.

8. The switching circuit according to claim 4, wherein the inverted first control signal output from the inverter is transferred to the switching unit.

9. The switching unit according to claim 4, further comprising:
- a buffer unit receiving and transferring the first control signal, the second control signal, and the third control signal to the switching unit,
- wherein signals output from the buffer unit are applied to the three first switches or the three second switches to control the turn-on/turn-off thereof.

* * * * *